US005721087A

United States Patent [19]

Yokoya et al.

[11] Patent Number: 5,721,087

[45] Date of Patent: Feb. 24, 1998

[54] FORMATION OF LITHOGRAPHIC PRINTING PLATE REQUIRING NO FOUNTAIN SOLUTION

[75] Inventors: Hiroaki Yokoya; Tsumoru Hirano; Norio Aoshima, all of Shizuoka, Japan

[73] Assignee: Fuji Photo Film Co., Ltd., Minami-ashigara, Japan

[21] Appl. No.: 710,028

[22] Filed: Sep. 11, 1996

[30] Foreign Application Priority Data

Sep. 13, 1995 [JP] Japan .................................... 7-259462

[51] Int. Cl.$^6$ .............................. G03F 7/34; G03F 7/039; G03F 7/075; G03F 7/09

[52] U.S. Cl. .......................... 430/200; 430/253; 430/303; 430/330; 430/964

[58] Field of Search .................................... 430/200, 253, 430/303, 330, 964

[56] References Cited

U.S. PATENT DOCUMENTS 5,171,650 12/1992 Ellis et al. .............................. 430/201
5,378,580 1/1995 Leenders ................................ 430/303
5,506,085 4/1996 Van Damme et al. ................. 430/200

FOREIGN PATENT DOCUMENTS 0573091 12/1993 European Pat. Off. .
17-21879 10/1942 Japan .
50-158405 12/1975 Japan .
WO94/01280 1/1994 WIPO .

*Primary Examiner*—Richard L. Schilling
*Attorney, Agent, or Firm*—Burns, Doane, Swecker & Mathis, LLP

[57] ABSTRACT

A method for forming a lithographic printing plate requiring no fountain solution, which comprises the steps of irradiating a lithographic printing plate precursor requiring no fountain solution comprising a support having a layer for converting a laser beam to heat (first layer) and a layer having an ink-repellent surface (second layer) provided thereon in this order with the laser beam absorbable by the first layer to conduct image exposure, pressing an adhesive sheet layer on the second layer, the sheet having a surface layer adhesive to a surface of the second layer, and thereafter separating the adhesive sheet, thereby forming an image which makes it possible to perform printing requiring no fountain solution.

5 Claims, 3 Drawing Sheets

FORMATION OF LITHOGRAPHIC PRINTING PLATE REQUIRING NO FOUNTAIN SOLUTION

FIELD OF THE INVENTION

The present invention relates to a method for forming a lithographic printing plate requiring no fountain solution (hereinafter referred to as a waterless printing plate) which can be formed by heat mode recording using a laser beam.

In this specification, a lithographic printing plate precursor (or a waterless printing plate precursor) means a printing plate before image recording in a state in which an image pattern of an ink-receiving area and a non-ink-receiving area is not formed, and a lithographic printing plate (or a waterless printing plate) means a printing plate on which an image pattern of an ink-receiving area and a non-ink-receiving area is formed, and which can be used for printing as such.

BACKGROUND OF THE INVENTION

As to printing plate techniques for printing, letterpress printing, gravure printing and lithographic offset printing are known as traditional techniques. In recent years, printing using lithographic printing plates has increased except for special fields. In this lithographic offset printing, there are known a water printing plate on a surface of which an image pattern of a hydrophilic area and a hydrophobic area is formed and which requires a fountain solution, and a waterless printing plate on a surface of which an image pattern of an ink-repellent area and ink-receiving area is formed and which requires no fountain solution. The waterless printing plate has characteristics more advantageous than those of the water printing plate, in that no skill is required for a printing operation because of no use of a fountain solution, and in that the density of ink is stable from the beginning of printing and little breakage is produced, which is economical even when a small number of prints are made.

With the progress of computer techniques, prepress processing prior to printing has been digitalized, and printing images have been converted to digital data. Recently, techniques of forming printing plate materials directly from the digital data without using lithographic films (computer-to-plate techniques) have been developed. However, these techniques form water printing plates in many cases, and techniques which can form waterless printing plates are scarcely known.

As an example in which a waterless printing plate can be formed by laser beam writing, the oldest disclosure is seen in JP-B-42-21879 (the term "JP-B" as used herein means an "examined Japanese patent publication"), in which it is described that an ink-repellent silicone layer is partially removed by laser beam irradiation to form an ink-receiving area, thereby conducting waterless printing. However, this method has the problems that silicone of a laser beam-irradiated area is scattered over the entire surface of the printing plate, which causes inconvenience in printing, and that the silicone layer is not sufficiently removed only by laser beam irradiation and the area of the ink-receiving area increases (dots are gained) with the progress of printing.

Further, JP-A-50-158405 (the term "JP-A" as used herein means an "unexamined published Japanese patent application") discloses a method of irradiating a printing plate precursor having a silicone rubber surface layer with a YAG laser beam or an infrared laser beam, and removing the laser beam-irradiated area by treatment with a solvent (naphtha), thereby forming a waterless printing plate. However, this method has the disadvantage that the treating solution for removal of silicone is required.

EP-0573091 discloses a method of irradiating a printing plate material having a silicone rubber surface layer with a YAG laser beam, and then abrading off the silicone rubber under solvent-free dry conditions or giving a solvent which does not swell the silicone rubber, thereby forming a waterless printing plate. In this disclosure, isopropanol is used as the solvent which does not swell the silicone rubber. However, care should be taken for handling of such a solvent, and the burden for treatment of waste fluid is imposed. Accordingly, the use of such a solvent is desired to be avoided also from the viewpoint of environmental conservation. On the other hand, the example points out that a printing plate obtained by dry treatment is lowered in resolving power, compared with a printing plate obtained by treatment using a liquid in combination. Further, the example also describes that the image area of ink-receiving areas varies with the progress of printing for both of them.

WO-9401280 discloses a method of irradiating a printing plate precursor having a silicone layer provided with a cover sheet with a laser beam to transfer the silicone layer to the cover sheet, and then removing the cover sheet by separation, thereby forming a waterless printing plate. However, in order to sufficiently remove the silicone layer only by separation, it is necessary to provide an adhesive layer between the silicone layer and the cover sheet. The waterless printing plate in which the adhesive layer is previously provided between the silicone layer and the cover sheet has the problems with regard to the stability of the material that a component of the adhesive layer successively moves into the silicone layer during its storage to change a composition thereof, resulting in deterioration of printing performance, and that the adhesive property varies during its storage, and the adhesive layer remains on the silicone layer even after separation to deteriorate the original ink repellency of the silicone layer.

The laser beam exposure described in JP-B-42-21879, JP-A-50-158405 and EP-0573091 has the problem that silicone itself is scattered by abrasion at the time of exposure to contaminate a recording system such as a laser optical system. The contamination of the recording systems reduces the laser output, resulting in infeasibility of stable laser recording for a long period of time and in necessity of operations such as washing, maintenance and checks of the recording system.

On the other hand, in WO-9401280 described above, the printing plate precursor is covered with the cover sheet to prevent a surface thereof from being exposed so that an abrasion component does not contaminate the recording system (laser optical system), and irradiated with the laser beam to perform thermal transfer. However, this suffers another problem of the above-mentioned deterioration of storing properties.

Previously, it was necessary to treat a printing plate after laser recording with a treating solution, so that two separate devices (a laser beam writing device and a printer) were required for laser image recording and printing, respectively. Accordingly, this inevitably necessitated manual work such as replacement of the printing plate between the two devices.

If easy, simple treatment using no treating solution to the printing plate becomes possible, laser image recording and printing can be conducted on the same device (laser recording can be performed on a cylinder of the printer), which requires no replacement of the printing plate, resulting in feasibility of a very reasonable printing system.

As described above, for the methods for forming the waterless printing plates with the laser beams, some methods have previously been proposed. However, they have problems with regard to contamination of the recording systems and methods for removing the silicone layers, and the performance problems of the resolving power, the printing performance, the storing properties, the environmental conservation, etc. are not sufficiently solved yet.

Further, the realization of a reasonable system in which laser writing and printing can be executed on the same device has been expected.

SUMMARY OF THE INVENTION

An object of the present invention is to provide a method for forming a waterless printing plate in which laser recording can be performed, and which satisfies the resolving power, the printing performance, the storing properties and the environmental conservation.

Another object of the present invention is to realize laser recording stable for a long period of time without contamination of a recording system such as a laser optical system.

A further object of the present invention is to provide a method for removing silicone from a waterless printing plate in which laser recording can be performed, and which has good resolving power without use of a treating solution such as a solvent.

A still further object of the present invention is to realize a reasonable waterless printing plate printing system in which laser writing and printing can be executed on the same device by doing without a treating solution such as a solvent.

The present inventors have conducted intensive investigation of formation methods of waterless printing plates in which laser writing can be performed. As a result, the above-mentioned objects have been attained by the following method for forming a printing plate.

According to the present invention, there is provided a method for forming a lithographic printing plate requiring no fountain solution, which comprises the steps of:

- irradiating a lithographic printing plate precursor requiring no fountain solution comprising a support having a layer for converting a laser beam to heat (first layer) and a layer having an ink-repellent surface (second layer) provided thereon in this order with the laser beam absorbable by the first layer to conduct image exposure,
- pressing an adhesive sheet on the second layer, the adhesive sheet having a surface layer adhesive to the surface of the second layer, and
- thereafter separating the adhesive sheet, thereby forming an image which makes it possible to perform printing requiring no fountain solution.

DETAILED DESCRIPTION OF THE INVENTION

Figure 1:
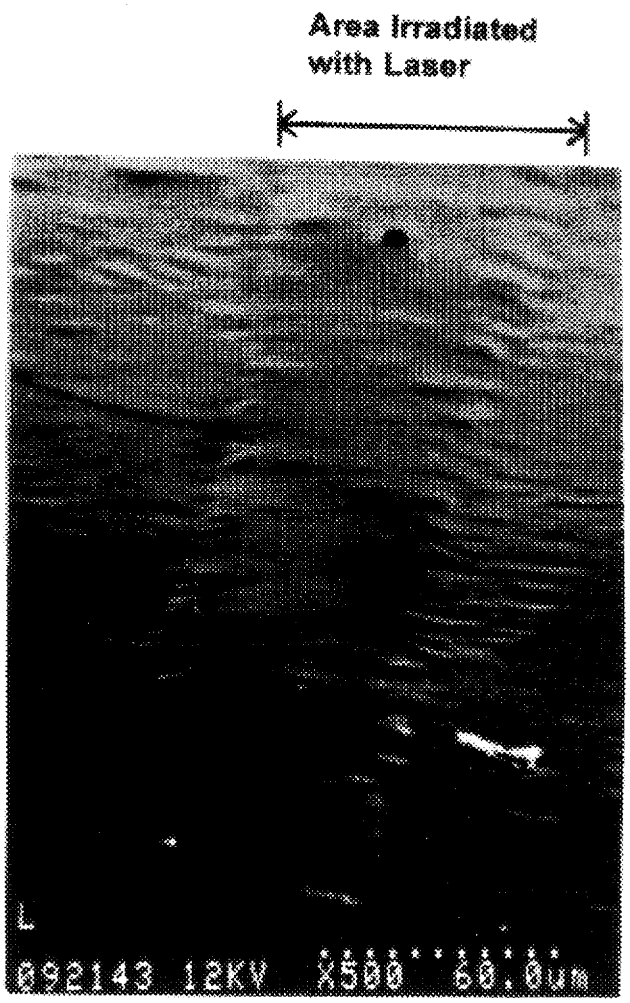
FIG. 1 is an electron micrograph of a fine structure formed after laser recording on a surface of a waterless printing plate prepared in Example 1.

The waterless printing plate used in the present invention comprises a support having a layer for converting laser beam to heat (first layer) and a layer having ink-repellent surface (second layer) provided thereon. The first layer is formed between the support and the second layer having the ink-repellent surface.

When the printing plate precursor is irradiated with a laser beam, the laser energy is absorbed by the first layer, and the temperature of the first layer in which the laser beam is converted to heat is rapidly elevated concurrently with the laser irradiation, resulting in deterioration of the adhesive property at any portion between the support and the ink-repellent second layer by a chemical reaction or a physical change such as combustion, fusion, decomposition, vaporization or explosion (abrasion) of a part or all of the second layer. Such deterioration of the adhesive property takes place only in the laser-irradiated area, so that an ink-repellent substance can be selectively removed by pressing an adhesive sheet on the surface of the second layer and separating it.

Support

As the support, any support generally used for offset printing (e.g., those made of metals, plastic films, paper and their composite forms) can be used. It is naturally necessary to fulfill physical suitable abilities such as mechanical strength and elongation-resistant characteristics required under the printing conditions used. Examples thereof include supports of metals such as aluminum, supports of plastics such as polyethylene terephthalate, polyethylene naphthalate and polycarbonates, paper and composite sheets in which paper sheets are laminated with plastic films such as polyethylene and polypropylene films.

The film thickness of the support is generally from 25 µm to 3 mm, and preferably from 75 µm to 500 µm. However, the optimum thickness varies depending on the kind of support and the printing conditions used. In general, it is most preferably from 100 µm to 300 µm.

These supports can be subjected to various surface treatments or surface coating processes for the purpose of enhancing the adhesive property to an adjacent layer such as the first layer formed on the support. As these surface treatments and surface coating processes, known treating methods such as corona treatment, coating of various kinds of coupling agents and coating of adhesive resins such as gelatin can be used.

First Layer

The first layer which can be used in the present invention is a layer having the function of converting laser beams used for writing to heat (light-heat conversion). As such a layer, known light-heat conversion layers comprising a light-heat conversion material can be used.

When infrared lasers are used as laser sources, the examples of the light-heat conversion material to be used for the first layer include various organic and inorganic materials which absorb light having the wavelengths of writing laser beams used, such as infrared absorption dyes, infrared absorption pigments, infrared absorption metals and infrared absorption metal oxides.

The light-heat conversion material can be used in the form of a single film made of the light-heat conversion material only or in the form of a mixed film in the light-heat conversion material and other components such as a binder and an additive are mixed. In the case of the single film, metals such as aluminum, metal oxides, organic dyes or the like can be deposited over the support to form the first layer.

In the case of the mixed film, the light-heat conversion material can be applied together with other components in the form of a solution or dispersion by a coating method to form the first layer. The amount of the light-heat conversion material in the mixed film is generally 1 to 70% by weight, preferably from 5 to 50% by weight, more preferably from 10 to 45% by weight.

Light-Heat Conversion Material

Examples of the light-heat conversion material include the organic pigments, organic dyes, metal and metal oxide. Examples of the organic pigment include various carbon blacks such as acidic carbon black, basic carbon black and neutral carbon black, various carbon black surface-modified or surface-coated for improvements in dispersibility, etc., and Nigrosine pigments. Examples of the organic dye include various compounds described in Matsuoka, *Infrared Sensitizing Dyes*, Plenum Press, New York, N.Y. (1990), U.S. Pat. No. 4,833,124, EP-321923, U.S. Pat. Nos. 4,772,583, 4,942,141, 4,948,776, 4,948,777, 4,948,778, 4,950,639, 4,912,083, 4,952,552 and 5,023,229. Examples of the metal and metal oxide include aluminum, indium-tin oxides, tungsten oxide, manganese oxide and titanium oxide. In addition, conductive polymers such as polypyrroles and polyanilines can also be used.

Binder

When the first layer is formed as a mixed film, known binders capable of dissolving or dispersing the light-heat conversion material can be used. Examples thereof include cellulose, cellulose derivatives such as nitrocellulose and ethyl cellulose, homopolymers and copolymers of acrylates and methacrylates such as polymethyl methacrylate and polybutyl methacrylate, homopolymers and copolymers of styrenic monomers such as polystyrene and poly(α-methylstyrene), various synthetic rubbers such as isoprene and styrene-butadiene, homopolymers of vinyl esters such as polyvinyl acetate, copolymers thereof such as vinyl acetate-vinyl chloride copolymers, various condensation polymers such as polyureas, polyurethanes, polyesters and polycarbonates, and binders used in so-called "chemical amplification systems" described in Frechet et al., *J. Imaging Sci.*, 30(2), pp. 59–64 (1986), Ito and Willson, *Polymers in Electronics* (*Symposium Series*), 242, p. 11, T. Davidson, Ed., ACS Washington, D.C. (1984) and E. Reichmanis and L. F. Thompson, *Microelectronic Engineering*, 13, pp. 3–10 (1991).

Additive

When the first layer is formed as a mixed film, an additive can be used in addition to the light-heat conversion material and the binder. The additive is added for various purposes of improving the mechanical strength of the first layer, improving the laser recording sensitivity, improving the dispersibility of the dispersions contained in the first layer, and improving the adhesive property to the adjacent layers such as the support and the second layer.

For example, in order to improve the mechanical strength of the first layer, crosslinking of the first layer is considered. In this case, various kinds of crosslinking agents can be added.

Further, known compounds which are decomposed by heating to produce acidic compounds can be used as an additive. The use of such a compound in combination with the binder in the chemical amplification system can greatly lower the decomposition temperature of constituent substances of the first layer, resulting in an improvement in the sensitivity of laser recording. Examples of the compound include various kinds of iodonium salts, sulfonium salts, phosphonium tosylates, oxime sulfonates, dicarbodiimide sulfonates and triazines.

When pigments such as carbon black are used as the light-heat conversion material, the degree of dispersion of the pigments sometimes affects the sensitivity of laser recording. Further, it is necessary in many cases to improve the degree of dispersion of the pigments for the purpose of stably coating the second layer. Various pigment dispersing agents are therefore used as an additive.

Besides, various additives such as a surfactant for improving the coating properties are used if necessary.

Film Thickness

When the first layer is a single film, the first layer can be formed by the deposition process as a thin film. In this case, the film thickness is generally from 50 Å to 1,000 Å, and preferably from 100 Å to 500 Å. When the first layer is a mixed film, it can be formed by coating. In this case, the film thickness is generally from 0.05 μm to 10 μm, and preferably from 0.1 μm to 5 μm. If the film thickness of the first layer is too thick, there is a possibility of causing unfavorable results such as deterioration of the sensitivity of laser recording.

Second Layer

The second layer which can be used in the present invention is a layer having ink-repellent surface. Known layers having ink-repellent surface can be used.

In the known ink-repellent surfaces, materials having low surface energy are contained. As such materials, fluorine compounds or silicone compounds are well known. In particular, silicone rubber (silicone elastomers) can be preferably used in the ink-repellent layer of the waterless printing plate.

The silicone rubber is roughly classified into three categories: (1) condensation type silicone rubber, (2) addition type silicone rubber and (3) radiation curing type silicone rubber. Any known silicone rubber compound can be used as the silicone rubber for the second layer of the waterless printing plate in the present invention.

The condensation type silicone rubber is silicone rubber formed by the condensation reaction. Usually, a polydimethylsiloxane having a terminal silanol group (—Si—OH) is used as a base polymer, and a condensation type crosslinking agent represented by the following general formula is allowed to react therewith by condensation in the presence of a known catalyst such as an organic tin compound or an organic titanium compound, thereby synthesizing the condensation type silicone rubber.

$$R_m \cdot Si \cdot X_n \ (m+n=4, \text{ n is a number of 2 or more})$$

wherein R is an alkyl group having 1 to 10 carbon atoms or an aryl group having 6 to 20 carbon atoms, which may have a substituent; X represents a halogen atom such as Cl or Br, a hydrogen atom, a hydroxyl group or an organic group such as —OCOR$^1$, —OR$^2$ or —O—N=C(R$^4$)—R$^3$, wherein R$^1$ is an alkyl group having 1 to 10 carbon atoms or an aryl group having 6 to 20 carbon atoms, which may have a substituent, and R$^2$, R$^3$ and R$^4$ each are an alkyl group having 1 to 10 carbon atoms, which may have a substituent.

The addition type silicone rubber is silicone rubber produced by the addition reaction of an Si—H group to a double bond group by hydrosilylation. Usually, a terminal vinyl-substituted polydimethylsiloxane is used as a base polymer, and of a silicone compound having plural Si—H groups as a crosslinking agent is allowed to react therewith by hydrosilylation in the presence of a known platinum catalyst to produce the addition type silicone rubber.

The radiation curing type silicone rubber is synthesized by crosslinking a silicone base polymer having functional groups polymerizable by radiation irradiation. Usually, a base polymer having acrylic functional groups is used, and crosslinked by ultraviolet irradiation to produce the radiation curing type silicone rubber.

The above-mentioned silicone rubber is described in detail in *R & D Report, No. 22, Advanced Application Techniques of Silicone,* published by CMC (1982), JP-B-56-23150, JP-A-3-15553 and JP-B-5-1934.

The first layer may be coated with the above-mentioned silicone rubber directly or through another layer. However, in the case of the condensation type or addition type silicone rubber, a coating solution prepared by dissolving a base polymer, a crosslinking agent and a catalyst is applied and heated, which causes the crosslinking reaction to form a silicone rubber layer. For the radiation curing type silicone rubber, a solution in which a base polymer and an initiator are dissolved is used as a coating solution, and the whole surface of a coated layer is exposed to radiation after coating to form a silicone rubber layer.

The film thickness of the silicone rubber layer is generally from 0.3 μm to 20 μm, preferably from 0.5 μm to 10 μm, and more preferably 0.7 μm to 3 μm.

In order to improve the adhesive property of the second layer to the adjacent layers, known adhesion improvers may be added to the coating solution for the second layer. Further, the adjacent layers may previously be subjected to the surface treatment for enhancing the adhesion to the silicone rubber layer. As compounds having such an effect, titanium coupling agents such as polytetrabutyl titanate and polytetraisopropyl titanate can be advantageously used.

Other Additional Layers

An additional layer can be provided between the support and the first layer for various purposes. For example, in order to improve the ink acceptability of laser-exposed, silicone-removed areas, an ink-receiving layer can be provided. For the formation of the ink-receiving layer, a known organic coating having ink-receptivity such as coating of various polymers such as acrylic, methacrylic, styrenic, vinyl ester, polyester and polyurethane polymers can be utilized. When a non-ink-receiving substance such as a metal is used as the support, such an ink-receiving layer is effective.

Further, in order to relax the pressure to the silicone layer in printing, a coating can be provided between the support and the first layer. When the support is made of metal having no pressure relaxation ability, such a coating is effective. The organic coating described above also sufficiently functions for this purpose.

Adhesive Sheet

The adhesive sheet used for removal of the silicone layer in the present invention is now described. The adhesive sheet comprises at least a flexible support and an adhesive layer. The adhesive layer has a surface adhesive to the surface of the second layer of the waterless printing plate of the present invention. The flexible support is a flexible support which can carry the adhesive layer. The adhesive sheet may be in the form of a sheet, or in the form of a roll in which the sheet is wound with the adhesive layer facing outside.

The flexible support is a flexible sheet-like material such as plastic films and paper. For example, various known films of polyethylene terephthalate, polyethylene, polypropylene, polyvinyl chloride, etc. can be used. Composite materials such as paper laminated with plastic sheets and plastic sheets over which a metal is deposited can also be used. The film thickness is generally from 25 μm to 500 μm, and preferably from 50 μm to 175 μm.

As the adhesive layer, any known layer adhesive to the surface of the second layer can be used. The composition of such an adhesive layer is described, for example, in JP-A-51-127132, JP-A-57-168974, JP-A-47-32047, JP-A-63-22886, JP-A-63-291971, JP-A-56-49778, JP-A-5-214316, JP-A-7-197008, JP-A-3-17178, and JP-A-5-98238. Commercial products of the adhesive which can be used for the adhesive layer include TSR1510, TSR1511, TSR1515, TSR1520, each by Toshiba Silicone Co., Ltd., and SH4280, SD4560, SD4570 and SD4580 each by Toray Dow Corning Co., Ltd.

Products comprising a flexible support and the adhesive layer provided thereon are commercially available, and examples thereof include "Scotch Tape #851A", "Scotch Tape #5413", "Scotch Tape #9336" and "Scotch Tape 5490" (each produced by Sumitomo 3M Ltd.), Sony Bond Tape T4080 (by Sony Chemicals Corporation), Tesa Tape #4428, Tesa Tape #4331 and Tesa Tape #4310 (each produced by Beiersdorf), and P-366, P-377, P-904 and P-904HD (each produced by Permacel).

Formation Method of Waterless Printing Plate

In the present invention, the laser beam energy used for recording is absorbed by the first layer of the waterless printing plate, and converted to the heat energy, thereby resulting in deterioration of the adhesive property at any portion between the support and the ink-repellent second layer by reactions and physical changes such as combustion, fusion, decomposition, vaporization and explosion. In many cases, the second layer (silicone rubber layer) of the laser-irradiated area is maintained as such on the surface of the waterless printing plate precursor after laser irradiation without damage and scattering. However, the adhesive property thereof to the lower layer is greatly lowered, so that the second layer of the laser-irradiated area can be easily removed by separation (see Examples).

In the present invention, a laser beam is used for exposure of the waterless printing plate. There is no particular limitation on the laser used, as long as it gives the exposure necessary for a reduction in the adhesive property sufficient for removal of the silicone layer by separation. Such a laser include gas lasers such as an Ar laser and a carbon dioxide laser, solid lasers such as an YAG laser, and semiconductor lasers. Usually, lasers having an output of 100 mW or more are required. From the practical points of view of maintenance, cost, etc., the semiconductor lasers and semiconductor-excited solid lasers (the YAG laser, etc.) are preferably used.

The recording wavelength of these lasers are in the range of the wavelength of infrared rays, and an oscillation wavelength of from 800 nm to 1100 nm is frequently used.

The present invention is characterized by selective removal of the ink-repellent substance by pressing the adhesive sheet on the surface of the ink-repellent second layer after laser irradiation and separating it, utilizing deterioration of the adhesive property of the laser-recorded area, thereby exposing the ink-receiving area to form the waterless printing plate.

The adhesive layer of the adhesive sheet is pressed on the surface of the second layer of the waterless printing plate so as not to be contaminated by air bubbles. At this time, it is required that the adhesive force between the adhesive layer and the surface of the second layer is greater than that of the printing plate material lowered by laser irradiation. When the sheet-like adhesive sheet is used, pressurization is performed from the back of the adhesive sheet or the back of the printing plate material with a pressing roll. The roll-like adhesive sheet is formed in the roll form with the adhesive layer facing outside, and therefore, pressed on the surface of the printing plate material as such. Separation can be conducted at any time after the time when the adhesive force between the adhesive layer and the surface of the second layer becomes greater than that of the printing plate material lowered by laser irradiation. Such a timing can be determined by conducting measurement of the adhesive force. The adhesive force between the adhesive layer and the surface of the second layer depends on pressure, temperature, and time of pressing the adhesive sheet onto the exposed printing plate and the adhesive force of the printing plate material lowered by laser irradiation depends on the condition of laser irradiation.

As described above, the waterless printing plates can be formed only by pressing and separation of the adhesive sheet after laser irradiation without use of any treating solution such as a solvent.

The present invention will be illustrated in greater detail with reference to examples below, but these are not to be construed as limiting the invention.

EXAMPLE 1

Support

A gelatin undercoat layer is formed as an adhesion layer on a polyethylene terephthalate film having a thickness of 175 μm so as to give a dry film thickness of 0.2 μm.

Preparation of Carbon Black Dispersion

A dispersion of the following composition was dispersed with a paint shaker for 30 minutes, and then, the glass beads were filtered off to prepare a carbon black dispersion.

| | |
|---|---|
| Carbon Black (#40 manufactured by Mitsubishi Carbon Co.) | 5.0 g |
| Polyurethane (Nippollan 2304 manufactured by Nippon Polyurethane Industry Co., Ltd.) | 5.0 g |
| Solsperse S20000 (available from ICI) | 0.27 g |
| Solsperse S12000 (available from ICI) | 0.22 g |
| Tetrahydrofuran | 45 g |
| Glass Beads | 160 g |

Formation of First Layer

The above-mentioned polyethylene terephthalate film undercoated with gelatin was coated with the following coating solution so as to give a dry film thickness of 2 μm, thereby forming a first layer.

Carbon Black Dispersion Described Above 55 g

Nitrocellulose (containing 30% n-propanol) 7.2 g

Tetrahydrofuran 45 g

Formation of Second Layer

The following coating solution was prepared, applied to the first layer, heated at 110° C. for 2 minutes, and dried, thereby forming a second layer composed of addition type silicone rubber having a dry film thickness of 2 μm to form a waterless printing plate precursor for laser recording.

| | |
|---|---|
| α, ω-Divinylpolydimethylsiloxane (the degree of polymerization: about 700) | 9.00 g |
| $(CH_3)_3$-Si-O-$(SiH(CH_3)$-$O)_8$-$Si(CH_3)_3$ | 0.50 g |
| Polydimethylsiloxane (degree of polymerzation: about 8000) | 0.50 g |
| Olefin-chloroplatinic Acid | 0.04 g |
| Inhibitor [HC≡C-$C(CH_3)_2$-O-$Si(CH_3)_3$] | 0.07 g |
| Heptane | 55 g |

Formation of Waterless Printing Plate

A continuous line was written in the resulting waterless printing plate precursor by use of a semiconductor-excited YAG laser having a wavelength of 1064 nm and a beam diameter of 100 μm ($1/e^2$). The recording energy was 0.75 $J/cm^2$. An electron micrograph of the surface of the printing plate after laser recording is shown in FIG. 1. This recording energy could not remove the silicone layer from the surface of the printing plate by laser recording alone. The electron micrograph shows that silicone of the second layer came up by the impact of laser recording, but remained on the surface of the printing plate precursor.

Figure 2:
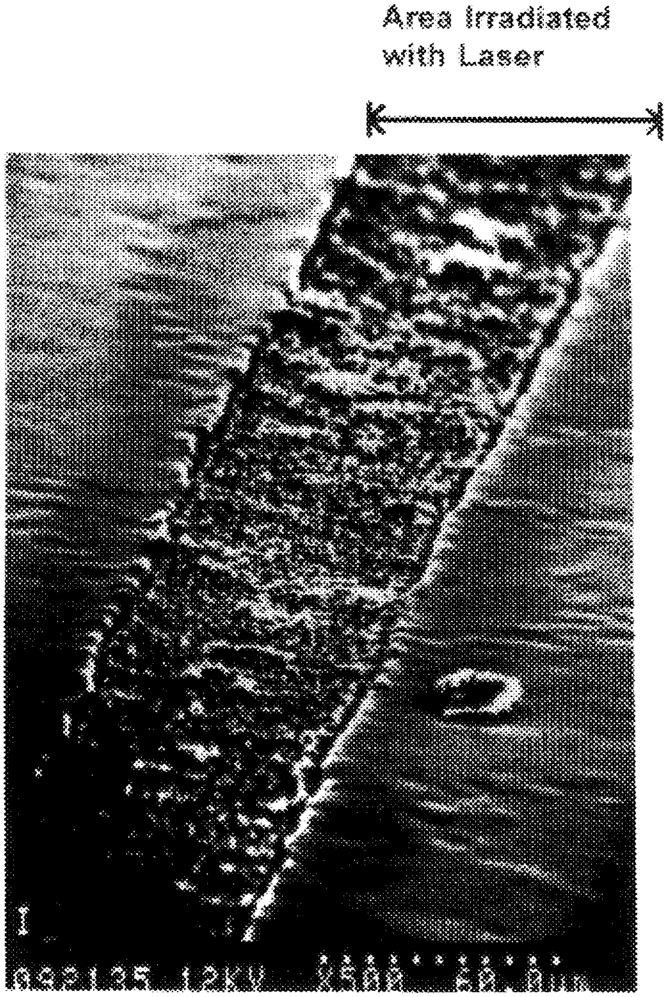
FIG. 2 is an electron micrograph of a fine structure printing plated on the surface of the waterless printing plate of Example 1 after pressing an adhesive sheet on the surface of the printing plate after laser recording and separating it.

However, an adhesive tape for silicone, "Scotch Tape #851A" manufactured by Sumitomo 3M Ltd, was pressed as the adhesive sheet on the surface of the waterless printing plate and separated, whereby a laser-irradiated area of the silicone layer (i.e., the second layer) adhered to the adhesive sheet, resulting in easy removal thereof from the surface of the waterless printing plate precursor. On the other hand, an area not irradiated with the laser beam of the silicone layer was not removed and maintained on the surface of the waterless printing plate precursor to form a silicone image having sharp edges. This state is indicated by an electron micrograph shown in FIG. 2.

Writing was conducted on the waterless printing plate precursor by use of a semiconductor laser having a power on a printing plate of 110 mW, a wavelength of 825 nm and a beam diameter of 10 μm ($1/e^2$), at a main operation speed of 6 m/second. As a result, a laser-irradiated area of the silicone layer came up similarly, but remained on the surface of the printing plate. The silicone was removed by pressing and separation of the same adhesive sheet to form a waterless printing plate. The sensitivity of laser recording was 300 $mJ/cm^2$, and the resolving power was 6 μm. The waterless printing plate having sharp edges was formed. Halftone dot formation of 200 lines was conducted under these conditions. As a result, a halftone dot area rate of 1% to 99% could be formed on the printing plate. The waterless printing plate thus formed was printed by use of a printer, thereby obtaining 20,000 good prints free from stains. Further, changes in performances such as recording properties and printing properties were not observed even after the printing plate precursor was stored at room temperature for one year.

COMPARATIVE EXAMPLE 1

A waterless printing plate precursor was prepared by the method described in Example 3 of JP-B-42-21879 as described below.

A polyethylene terephthalate film was coated with the following coating solution to form a layer having a dry film thickness of 5 μm.

| | |
|---|---|
| Linear Polyester Resin | 10 g |
| Nitrocellulose | 10 g |
| Carbon Black | 10 g |
| Ethyl Acetate | 40 g |
| Methyl Isobutyl Ketone | 40 g |

Then, the following coating solution was applied to give a dry amount coated of 1 g/m2.

| | |
|---|---|
| Siltex 30 (produced by Fuji Koubunshi Kogyo K.K.) (the concentration of non-volatile components: 30%) | 10 g |
| Glacial Acetic Acid | 0.03 g |
| Catalyst for Siltex 30 | 0.5 g |
| Xylene | 20 g |

The resulting coated material was heat treated at 150° C. for 10 minutes to cure it.

Figure 3:
FIG. 3 is an electron micrograph of a fine structure formed after laser recording on the surface of a waterless printing plate prepared in Comparative Example 1.

Writing was conducted by use of the semiconductor-excited YAG laser in the same manner as in Example 1 except that the power of the writing laser was changed to 2.4 $J/cm^2$. As a result, a laser-irradiated area of the silicone layer was destroyed and partly removed from the surface of the printing plate. However, the silicone was not completely removed in part, particularly at edge portions, and remained on the surface of the printing plate. This state is indicated by an electron micrograph shown in FIG. 3.

Thus, the silicone layer could be destroyed by laser irradiation alone. However, not only the energy necessary for recording increased, but also an image formed on the waterless printing plate became blurred at its edges. This printing plate showed various disadvantages such as an increase in image area because of removal of the silicone at the edge portions with the progress of printing.

Further, when laser recording was continuously performed on a large number of printing plate materials, components of the printing plate materials destroyed were scattered in the air to gradually contaminate a recording unit such as an optical system, followed by a decrease in laser output. Thus, the phenomenon occurred that writing good in reproducibility became impossible. That is, the stability of the recording system lacked.

COMPARATIVE EXAMPLE 2

The adhesive sheet used in Example 1 was previously pressed on the waterless printing plate precursor prepared in Example 1 to produce a waterless printing plate precursor having a cover sheet.

Writing was performed with the semiconductor-excited YAG laser in the same manner as in Example 1, followed by separation of the cover sheet to form a waterless printing plate. As a recording image, a good silicone image could be formed similarly to Example 1. However, when this printing plate was subjected to laser recording, removal of the cover sheet and printing in the same manner as above after storage thereof at room temperature for one year, the force required for separation was increased, resulting in difficulty of separation in part. Further, an area not irradiated with the laser beam was partially removed, which caused printing stains. Furthermore, the adhesive layer of the adhesive sheet remained on the silicone surface in part to generating poor printing.

Like this, for the waterless printing plate precursor previously having the cover sheet, various inconvenient phenomena occurred in separation and printing with an elapse of time. It was therefore impossible to put this printing plate to practical use.

EXAMPLE 2

A 3-μm thick lipophilic layer composed of a polyurethane was formed on a 0.24-mm thick aluminum support.

Formation of First Layer

A mixture having the following composition was dispersed with a paint shaker for 30 minutes, and then, the glass beads were filtered off to prepare a coating solution for a first layer. The above-described aluminum support having the lipophilic layer was coated with this coating solution to give a dry film thickness of 2 μm, thus forming the first layer.

| | |
|---|---|
| Carbon Black (#40 manufactured by Mitsubishi Carbon Co.) | 5.0 g |
| Nigrosine | 2.0 g |
| Polyurethane (Nippollan 2304 manufactured by Nippon Polyurethane Industry Co., Ltd.) | 5.0 g |
| Solsperse S20000 | 0.27 g |
| Solsperse S12000 | 0.22 g |
| Nitrocellulose (containing 30% n-propanol) | 7.2 g |
| Tetrahydrofuran | 100 g |
| Glass Beads | 160 g |

Formation of Second Layer

The following coating solution was applied to the first layer, heated at 110° C. for 20 minutes, and dried, thereby forming a second layer composed of condensation type silicone rubber having a dry film thickness of 2 μm to form a waterless printing plate precursor for laser recording.

| | |
|---|---|
| Dimethylpolysiloxane Having Hydroxyl Groups at Both Terminals (the degree of polymerization: about 700) | 9.00 g |
| Methyltriacetoxysilane | 0.63 g |
| Dibutyltin Dioctanate | 0.02 g |
| Heptane | 53.9 g |

Formation of Waterless Printing Plate

Writing was performed on the resulting waterless printing plate precursor by use of a semiconductor laser having a power on a printing plate of 110 mW, a wavelength of 825 nm and a beam diameter of 10 μm ($1/e^2$), at a main operation speed of 6 m/second. As a result, a laser-irradiated area of the silicone layer came up similarly to Example 1, but remained on the surface of the printing plate. An adhesive sheet obtained by winding the same sheet as used in Example 1 in the roll form with the adhesive layer facing outside was pressed on the surface of the waterless printing plate precursor, and separated to remove the silicone, thereby forming a waterless printing plate. Similarly to Example 1, the waterless printing plate having a resolving power of 6 μm, which had sharp image edges, was formed. Halftone dot formation of 200 lines was conducted under these conditions. As a result, a halftone dot area rate of 1% to 99% could be formed on the printing plate. The waterless printing plate thus formed was printed by use of a printer, thereby obtaining 50,000 good prints free from stains. Further, changes in performances such as recording properties and printing properties were not observed even after the printing plate precursor was stored at room temperature for one year.

EXAMPLE 3

A gelatin undercoat layer is formed as an adhesion layer on a polyethylene terephthalate film having a thickness of 175 μm so as to give a dry film thickness of 0.2 μm.

Formation of First Layer

Aluminum was deposited over the above-mentioned support to give a thickness of 200 Å, thereby forming a first layer.

Formation of Second Layer

A second layer composed of condensation type silicone rubber having a dry film thickness of 2 μm was formed on the first layer in the same manner as in Example 2 to form a waterless printing plate precursor for laser recording.

Formation of Waterless Printing Plate

Writing was performed on the resulting waterless printing plate precursor by use of a semiconductor laser having a power on a printing plate of 110 mW, a wavelength of 825 nm and a beam diameter of 10 μm ($1/e^2$), at a main operation speed of 4 m/second. As a result, a laser-irradiated area of the silicone layer remained on the surface of the printing plate, but the adhesion thereof to the support was reduced. The silicone of the laser-irradiated area was selectively removed by pressing and separation of the same adhesive sheet as used in Example 1 to form a waterless printing plate. The resolving power of the resulting waterless printing plate was as high as 7 μm. Halftone dot formation of 200 lines was conducted under these conditions. As a result, a halftone dot area rate of 1% to 99% could be formed on the printing plate. Contamination of a recording unit such as an optical system due to laser recording was not observed, and writing good in reproducibility could be repeatedly performed at the same laser output.

As described above, the present invention can realize the method for forming the waterless printing plate which can be subjected to laser exposure, and which can satisfy the resolving power, the printing performance, the storing properties and the environmental conservation. Further, according to this method, laser recording stable for a long period of time can be conducted without contamination of the recording unit in laser recording. Furthermore, the easy, simple silicone removing method using no solvent for silicone removal can be realized. This makes it possible to realize the waterless printing plate system in which laser recording is made on the printing plate precursor mounted on a plate cylinder of a printer and silicone is removed on the printing cylinder.

While the invention has been described in detail with reference to specific embodiments, it will be apparent to one skilled in the art that various changes and modifications can be made to the invention without departing from its spirit and scope.

What is claimed is:

1. A method for forming a lithographic printing plate requiring no fountain solution, which comprises the steps of:

irradiating a lithographic printing plate precursor requiring no fountain solution comprising a support having a first layer for converting a laser beam to heat and a second layer having an ink-repellent surface provided thereon in this order with the laser beam absorbable by the first layer to conduct image exposure, pressing an adhesive sheet on the second layer after said laser irradiation, said adhesive sheet having a surface layer adhesive to the surface of the second layer, and thereafter separating the adhesive sheet, thereby forming an image which makes it possible to perform printing requiring no fountain solution.

2. The method for forming a lithographic printing plate requiring no fountain solution of claim 1, wherein the first layer contains at least one of the group consisting of organic pigments, organic dyes, metal and metal oxide.

3. The method for forming a lithographic printing plate requiring no fountain solution of claim 1, wherein the second layer is composed of a silicone rubber.

4. The method for forming a lithographic printing plate requiring no fountain solution of claim 3, wherein the thickness of the second layer is from 0.3 to 20 μm.

5. The method for forming a lithographic printing plate requiring no fountain solution of claim 1, wherein the lithographic printing plate precursor further comprises an ink-receiving layer between the support and the first layer.

* * * * *